United States Patent
Xu

(10) Patent No.: US 11,773,505 B2
(45) Date of Patent: Oct. 3, 2023

(54) REACTION CHAMBER

(71) Applicant: BEIJING NAURA MICROELECTRONICS EQUIPMENT CO., LTD., Beijing (CN)

(72) Inventor: Gang Xu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 17/802,843

(22) PCT Filed: Feb. 5, 2021

(86) PCT No.: PCT/CN2021/075520
§ 371 (c)(1),
(2) Date: Aug. 26, 2022

(87) PCT Pub. No.: WO2021/175089
PCT Pub. Date: Sep. 10, 2021

(65) Prior Publication Data
US 2023/0028116 A1    Jan. 26, 2023

(30) Foreign Application Priority Data
Mar. 6, 2020    (CN) .......................... 202010152523.3

(51) Int. Cl.
*C23C 16/40*    (2006.01)
*C30B 25/08*    (2006.01)
(Continued)

(52) U.S. Cl.
CPC ........ *C30B 25/08* (2013.01); *C23C 16/45565* (2013.01); *C23C 16/507* (2013.01); *C30B 25/14* (2013.01); *C30B 30/02* (2013.01)

(58) Field of Classification Search
CPC ......... C30B 25/08; C30B 25/14; C30B 30/02; C30B 29/40; C30B 29/48;
(Continued)

(56) References Cited

U.S. PATENT DOCUMENTS 6,245,192 B1 *  6/2001  Dhindsa ............ C23C 16/45572
                                                          438/731
6,872,258 B2 *  3/2005  Park .................. C23C 16/45589
                                                          156/345.33
(Continued)

FOREIGN PATENT DOCUMENTS

CN    101339895 A    1/2009
CN    101345184 A    1/2009
(Continued)

OTHER PUBLICATIONS

The World Intellectual Property Organization (WIPO) International Search Report for PCT/CN2021/075520 dated May 7, 2021 9 Pages (including translation).

*Primary Examiner* — Rudy Zervigon
(74) *Attorney, Agent, or Firm* — ANOVA LAW GROUP, PLLC

(57) ABSTRACT

The present disclosure discloses a reaction chamber, including a chamber body, the chamber body being connected to an upper cover by an insulation member, the chamber body and the upper cover forming an inner chamber, and the upper cover being provided with a through-hole that is communicated with the inner chamber; a gas inlet mechanism including an insulation body at least partially arranged in the through-hole, a gas inlet channel being arranged in the insulation body, a flange part being arranged on one side of the insulation body facing away from the inner chamber, the flange part being grounded and configured to communicate a gas inlet end of the gas inlet channel with a gas output end of a gas inlet pipe configure to transfer a reaction gas, a gas outlet end of the gas inlet channel being communicated with the inner chamber.

7 Claims, 6 Drawing Sheets

(51) Int. Cl.
*C23C 16/455* (2006.01)
*C23C 16/507* (2006.01)
*C30B 25/14* (2006.01)
*C30B 30/02* (2006.01)

(58) Field of Classification Search
CPC ............ C23C 16/45565; C23C 16/507; C23C 16/5096; C23C 16/509; Y02E 60/50; H01J 15/00; H01J 37/32091; H01J 37/32082; H01J 37/3244; H01J 37/32623; H01J 37/32009; H01J 37/32532; H01L 21/67069
USPC ..... 118/723 E, 723 ER; 156/345.43, 345.44, 156/345.45, 345.46, 345.47
See application file for complete search history.

(56) References Cited

U.S. PATENT DOCUMENTS

| | | | | |
|---|---|---|---|---|
| 7,717,061 | B2 * | 5/2010 | Ishizaka | ................ C23C 16/452 137/625.21 |
| 2003/0143841 | A1 * | 7/2003 | Yang | ..................... C23C 16/515 438/653 |
| 2004/0134611 | A1 * | 7/2004 | Kato | ..................... C23C 16/455 156/345.33 |
| 2005/0241765 | A1 * | 11/2005 | Dhindsa | .............. H01J 37/3244 156/345.37 |
| 2006/0162661 | A1 * | 7/2006 | Jung | ........................ C23C 16/50 134/1.1 |
| 2007/0187363 | A1 * | 8/2007 | Oka | .................. H01J 37/32449 156/345.33 |
| 2013/0126486 | A1 * | 5/2013 | Bise | .................. H01J 37/32642 219/121.48 |
| 2022/0051873 | A1 * | 2/2022 | Kim | .................... H01J 37/32119 |

FOREIGN PATENT DOCUMENTS

| | | |
|---|---|---|
| CN | 201924077 U | 8/2011 |
| CN | 103966574 A | 8/2014 |
| CN | 105103269 A | 11/2015 |
| CN | 205388967 U | 7/2016 |
| CN | 106337169 A | 1/2017 |
| CN | 107180782 A | 9/2017 |
| CN | 108538694 A | 9/2018 |
| CN | 108573891 A | 9/2018 |
| CN | 109487238 A | 3/2019 |
| CN | 111321463 A | 6/2020 |
| JP | 2013174023 A | 9/2013 |
| KR | 20070002218 A | 1/2007 |

\* cited by examiner

REACTION CHAMBER

CROSS-REFERENCE TO RELATED APPLICATIONS

This application is a national phase entry under 35 U.S.C. § 371 of International Application No. PCT/CN2021/075520, filed on Feb. 5, 2021, which claims priority to Chinese Application No. 202010152523.3 filed Mar. 6, 2020, the entire contents of all of which are incorporated herein by reference.

TECHNICAL FIELD

The present disclosure generally relates to the semiconductor apparatus technical field and, more particularly, to a reaction chamber.

BACKGROUND

In the semiconductor apparatus technical field, Metal-Organic Chemical Vapor Deposition (MOVCD) is a new vapor phase epitaxial growth technology developed based on vapor phase epitaxial growth. In MOVCD, organic compounds of a group III element and a group II element and hydrides of a group V element and a group VI element are used as crystal growth source materials, vapor phase epitaxy is performed on a substrate in a thermal decomposition reaction manner to grow various compound semiconductors of group III-V and group II-VI and thin layer single crystal materials of a multi-element solid solution of the compound semiconductors of group III-V and group II-VI.

Generally, the chamber includes two plate electrodes that are spaced at a certain interval and parallel to each other, wherein one plate electrode is connected to radio frequency and the other plate electrode is grounded. After a required material is grown on the surface of the substrate, a process gas is uniformed through a uniform flow chamber, then enters between the two plate electrodes, and is excited under an action of a radio frequency electric field to generate a plasma. The plasma reacts with the material generated by MOCVD on the surface of the substrate to reduce resistivity of a surface film layer of the substrate.

In a specific application process, since resistivity required by different materials are different, different RF power needs to be adjusted to perform the reaction. However, after the radio frequency power is increased, a sparking phenomenon occurs due to an accidental discharge, which occurs between a radio frequency electrode and a metal gas inlet of the chamber. Thus, uniformity of the resistivity of the surface material of the substrate is affected.

SUMMARY

The present disclosure discloses a reaction chamber to solve the problem that accidental sparking is easy to occur in an existing reaction chamber.

In order to solve the above problems, the present disclosure adopts the following technical solutions.

A reaction chamber includes:

a chamber body, the chamber body being grounded;

an upper cover, the upper cover being electrically connected to an electrode, the chamber body being connected to the upper cover through an insulation member, the chamber body and the upper cover forming an inner chamber, and a through-hole communicating with the inner chamber being formed at the upper cover; and a gas inlet mechanism, the gas inlet mechanism including an insulation body that is at least partially arranged in the through-hole, a gas inlet channel being arranged in the insulation body, a flange part being arranged on one side of the insulation body facing away from the inner chamber, the flange part being grounded and configured to communicate a gas inlet end of the gas inlet channel with a gas outlet end of a gas inlet pipe that is configured to transfer a reaction gas, a gas outlet end of the gas inlet channel being communicated with the inner chamber, the gas inlet channel including at least two channel segments communicated sequentially in an axial direction of the through-hole, and orthographic projections of any two adjacent channel segments on a plane perpendicular to the axial direction of the through-hole being staggered from each other.

In some embodiments, the insulation body includes at least two insulation blocks arranged in sequence in the axial direction of the through-hole, and each insulation block is provided with a gas inlet hole used as a channel segment.

In some embodiments, two insulation blocks are provided and include a first insulation block close to the inner chamber and a second insulation block facing away from the inner chamber, wherein the first insulation block is provided with a first gas inlet hole used as the channel segment, an accommodation space is formed on one side of the first insulation block facing away from the inner chamber, the second insulation block is arranged in the accommodation space, and the second insulation block is provided with a second gas inlet hole used as the channel segment.

In some embodiments, a gas inlet groove is arranged on an outer peripheral surface of the second insulation block, and the gas inlet groove and an inner wall of the accommodation space form the second gas inlet hole.

In some embodiments, a first groove is formed on a side of the second insulation block facing the inner chamber, the first groove and the inner wall of the accommodation space form a first gas chamber, and both the first gas inlet hole and the second gas inlet hole are communicated with the first gas chamber.

In some embodiments, a plurality of second gas inlet holes are provided and distributed along a peripheral direction of the first groove at intervals, and an orthographic projection of an inner peripheral surface of the first groove on a plane perpendicular to an axial direction of the through-hole overlaps partially with orthographic projections of the second gas inlet holes on the plane perpendicular to the axial direction of the through-hole.

In some embodiments, a plurality of first gas inlet holes are provided and arranged at the first insulation block at intervals.

In some embodiments, a second groove is provided on a side of the second insulation block facing away from the inner chamber (110), the second groove and the flange part form a second gas chamber, and the second gas chamber is respectively communicated with the gas inlet end of the gas inlet channel and the gas outlet end of the gas inlet pipe.

In some embodiments, a third groove is formed on a side of the flange part facing the second insulation block, and the third groove is butted with the second groove to form the second gas chamber.

In some embodiments, the gas inlet mechanism further includes a position limiting structure, and the position limiting structure is arranged between an outer peripheral surface of the second insulation block and an inner wall of the accommodation space to limit rotation of the second insulation block in the accommodation space.

In some embodiments, the reaction chamber is a metal-organic compound chemical vapor deposition process chamber.

The technical solution adopted by the present disclosure can achieve the following beneficial effects.

In the reaction chamber disclosed by embodiments of the present disclosure, orthographic projections of any two adjacent channel segments of the gas inlet channel on the plane perpendicular to the axial direction of the through-hole are staggered from each other. In this case, when the upper cover is powered-on through the electrode, a radio frequency electric field is difficult to be formed between the grounded flange part and the upper cover and the powered-on part of the upper cover. Thus, the occurrence of accidental discharge phenomenon may be reduced, the risk of generating the sparking phenomenon may be reduced, and finally, the uniformity and stability of the surface material of the substrate may be improved.

BRIEF DESCRIPTION OF THE DRAWINGS

The accompanying drawings described herein are used to provide a further understanding of the present disclosure and constitute a part of the present disclosure. Exemplary embodiments of the present disclosure and the description thereof are used to explain the present disclosure and do not form an improper limitation to the present disclosure. In the accompanying drawings.

REFERENCE NUMERALS

100 Chamber body, 110 Inner chamber, 120 Heater;
200 Upper cover, 210 Through hole, 220 Uniform flow plate, 230 Showerhead;
300 Electrode;
400 Insulation member;
500 Insulation body, 510 First insulation block, 511 Accommodation space, 512 First gas inlet hole, 513 Body member, 514 Position limiting member, 520 Second insulation block, 521 Second gas inlet hole, 522a First groove, 522b Second groove, 530 Gas inlet pipe, 540 Flange part, 541 Third groove, 550 Convex member, D1 diameter of first groove 522a, D2 diameter of inscribed circle formed by inner side edges of multiple gas inlet grooves;
500' Insulation body, 501 Gas inlet channel, 501a First gas inlet hole, 501b Second gas inlet hole, 501c Third gas inlet hole, 502a First connection channel, 502b Second connection channel, 503a First insulation block, 503b Second insulation block, 503c Third insulation block.

DETAILED DESCRIPTION OF THE EMBODIMENTS

In order to make the purposes, technical solutions, and advantages of the present disclosure clearer, the technical solutions of the present disclosure will be clearly and completely described below in connection with specific embodiments of the present disclosure and the corresponding accompanying drawings. Apparently, the described embodiments are only some embodiments of the present disclosure, not all the embodiments. All other embodiments obtained by those of ordinary skill in the art based on embodiments of the present disclosure without creative efforts shall be within the scope of the present disclosure.

The technical solutions disclosed in various embodiments of the present disclosure are described in detail below in connection with the accompanying drawings.

First Embodiment

As shown in FIG. 1 to FIG. 7, the first embodiment of the present disclosure discloses a reaction chamber. The disclosed reaction chamber may be a metal-organic chemical vapor deposition (MOCVD) process chamber. The disclosed reaction chamber includes a chamber body 100, an upper cover 200, and a gas inlet mechanism.

Figure 1:
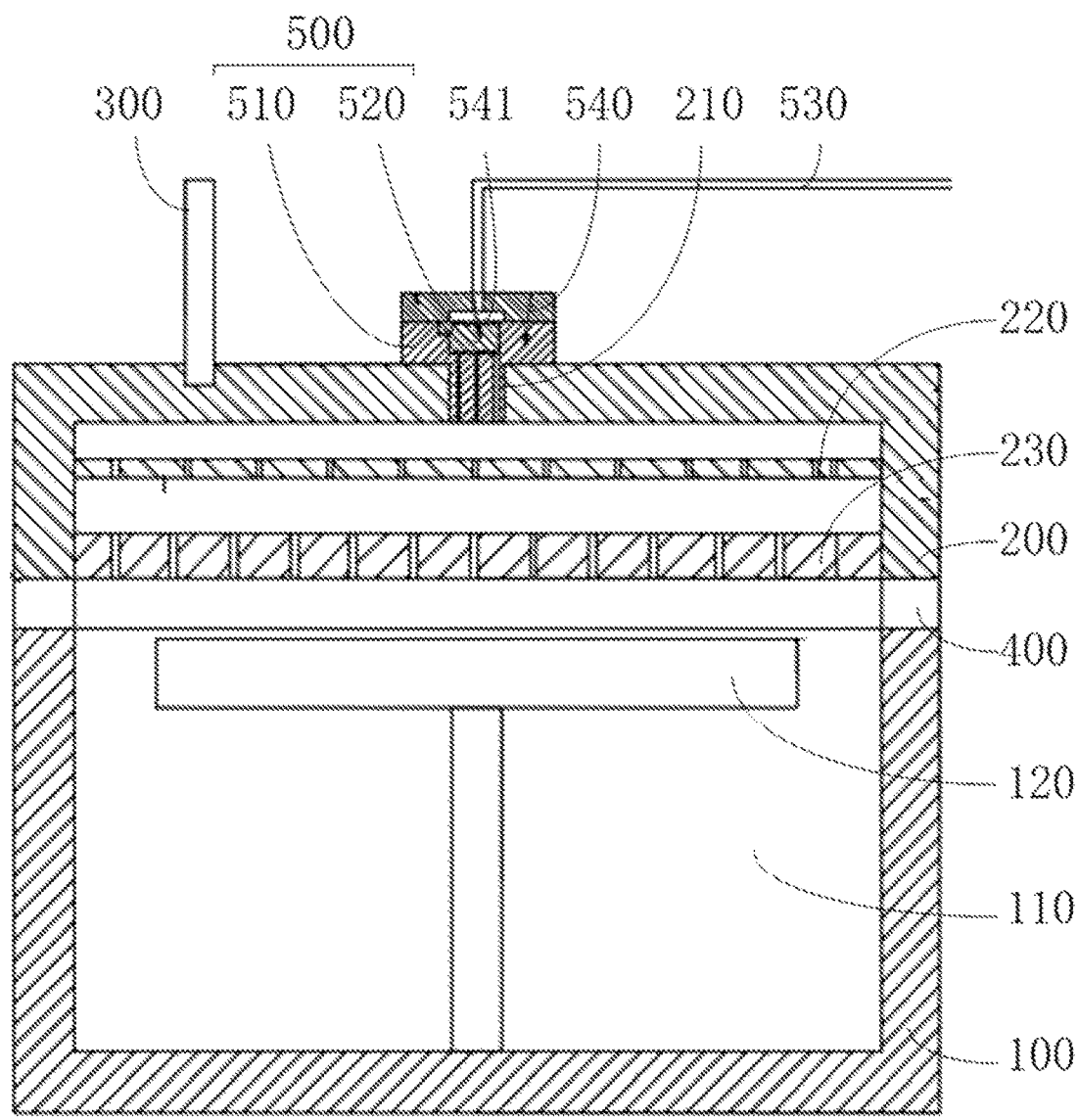
FIG. 1 is a schematic cross-sectional diagram of a reaction chamber according to a first embodiment of the present disclosure.

Referring to FIG. 1, the chamber body 100 is grounded. The upper cover 200 is electrically connected to an electrode 300. One end of the electrode 300 may be arranged, e.g., on the upper cover 200, and the other end is electrically connected to a radio frequency source and configured to load radio frequency power output by the radio frequency source to the upper cover 200. The chamber body 100 and the upper cover 200 are connected by an insulation member 400. In the case that the chamber body 100 is connected to the upper cover 200, the chamber body 100 and the upper cover 200 form an inner chamber 110. A portion of the inner chamber 110 that corresponds to the chamber body 100 may be a first hollow chamber, and a portion that corresponds to the upper cover 200 may be a second hollow chamber, wherein a heater 120 is arranged in the first hollow chamber and configured to carry a substrate and heat the substrate. In a process of performing chemical vapor deposition, organic compounds of a group III element and a group II element and hydrides of a group V element and a group VI element may be used as crystal growth source materials, and vapor phase epitaxy may be performed at the heater 120 in a thermal decomposition reaction manner to grow various compound semiconductors of group III-V and group II-VI and thin layer single crystal material of a multi-element solid solution thereof. At the same time, in order to reduce resistivity of the material, the heater 120 is grounded through the chamber body 100.

Referring again to FIG. 1, a uniform flow plate 220 and a showerhead 230 are arranged in the second hollow chamber. The uniform flow plate 220 is arranged opposite to the showerhead 230, and the showerhead 230 is arranged opposite to the heater 120. When the process is performed, the reaction gas first flows into the second hollow chamber. The uniform flow plate 220 in the second hollow chamber body may be configured to uniform the reaction gas to cause the reaction gas flowing out of the uniform flow plate 220 to be relatively uniform. Thereafter, the reaction gas flowing out of the uniform flow plate 220 flows into the showerhead 230. The showerhead 230 may be configured to spray the reaction gas flowing through to a surface of the substrate on the heater 120 to perform a vapor phase epitaxy reaction, so as to grow the required material on the surface of the substrate. In addition, the showerhead 230 may be electrically connected to the upper cover 200. When the upper cover 200 is powered-on, the showerhead 230 may be powered-on. A radio frequency electric field may be formed between the powered-on showerhead 230 and the grounded heater 120. The radio frequency electric field may reduce the resistivity of the material grown on the surface of the substrate.

Correspondingly, a through-hole 210 is arranged at the upper cover 200 in communication with the inner chamber 110. The gas inlet mechanism includes an insulation body 500, which is at least partially arranged in the through-hole 210. A gas inlet channel may be arranged in the insulation body 500, and a gas outlet end of the gas inlet channel may be communicated with the inner chamber 110. A flange part 540 is arranged on a side of the insulation body 500 facing away from the inner chamber 110. The flange part 540 may be grounded and configured to communicate the gas inlet end of the gas inlet channel with a gas outlet end of a gas inlet pipe 530 configured to transfer the reaction gas. Specifically, the flange part 540 is sealed and connected to the gas inlet pipe 530, so that the gas outlet end of the gas inlet pipe 530 may be communicated with the gas inlet end of the gas inlet channel. The other end of the gas inlet pipe 530 may be communicated with a container having the reaction gas.

Figure 4:
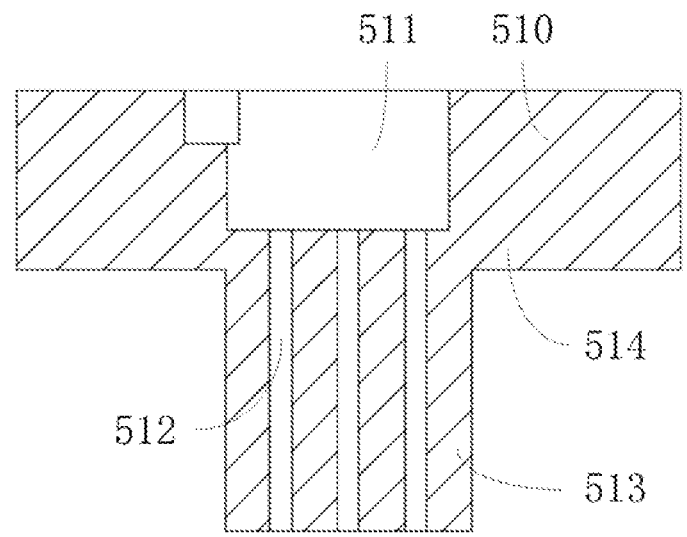
FIG. 4 is a schematic cross-sectional diagram showing a first insulation block in the reaction chamber according to the first embodiment of the present disclosure.
Figure 5:
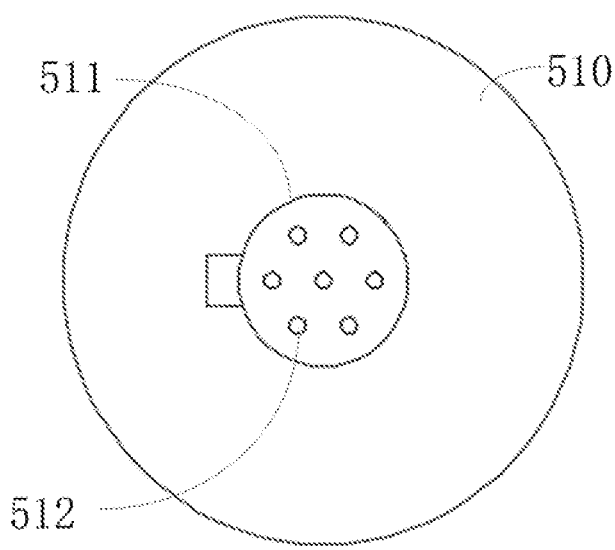
FIG. 5 is a schematic top view showing the first insulation block in the reaction chamber according to the first embodiment of the present disclosure.

The insulation body 500 may have a plurality of structures. In embodiments of the present disclosure, the insulation body 500 includes two insulation blocks arranged along an axis of the through-hole 210 in sequence, that is a first insulation block 510 close to the inner chamber 110 and a second insulation block 520 facing away from the inner chamber 110. At least a part of the first insulation block 510 may be located in the through-hole 210. As shown in FIG. 4, one side of the first insulation block 510 facing away from the inner chamber 110 is provided with an accommodation space 511, and the second insulation block 520 is arranged in the accommodation space 511. As shown in FIG. 1, the flange part 540 is arranged on a side surface of the first insulation block 510 facing away from the inner chamber 110 and blocks an opening of the accommodation space 511.

The second insulation block 520 is provided with a second gas inlet hole 521. The first insulation block 510 is provided with a first gas inlet hole 512. A gas inlet end of the first gas inlet hole 512 is communicated with a gas outlet end of the second gas inlet hole 521. The gas outlet end of the first gas inlet hole 512 is communicated with the inner chamber 110. Under this situation, the first gas inlet hole 512 and the second gas inlet hole 521 constitute two channel segments of the gas inlet channel, respectively. The reaction gas in the gas inlet pipe 530 may sequentially pass through the second gas inlet hole 521 and the first gas inlet hole 512 to flow into the inner chamber 110. In embodiments of the present disclosure, orthographic projections of the first gas inlet hole 512 and the second gas inlet hole 521 are staggered from each other on a plane perpendicular to an axial direction of the through-hole 210. That is, an axis of the first gas inlet hole 512 is not in a straight line with an axis of the second gas inlet hole 521. For example, the orthographic projection of the first gas inlet hole 512 is outside the orthographic projection of the second gas inlet hole 521. As such, when the upper cover is powered-on through the electrode, a radio frequency electric field is difficult to be formed between the grounded flange part and the upper cover and a powered-on part of the upper cover. Thus, occurrences of accidental discharge phenomenon may be reduced, a risk of generating the sparking phenomenon may be further reduced, and finally, the uniformity and stability of the surface material of the substrate may be improved.

Figure 3:
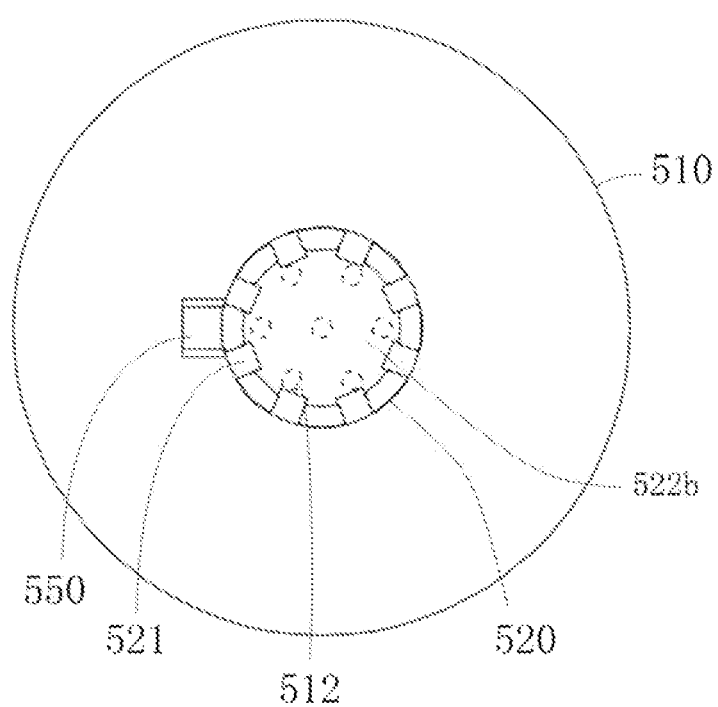
FIG. 3 is a schematic top view showing the insulation body in the reaction chamber according to the first embodiment of the present disclosure.

In embodiments of the present disclosure, optionally, as shown in FIG. 3, a gas inlet groove is arranged at an outer peripheral surface of the second insulation block 520. The gas inlet groove ad an inner wall of the accommodation space 511 may form the second gas inlet hole 521. Compared with directly arranging the second gas inlet hole 521 in the second insulation block 520, an arrangement of the gas inlet groove may be easier to process and form. Meanwhile, in this manner, the second gas inlet hole 521 may be caused to be in an edge region of the second insulation block 520. Thus, the orthographic projection of the second gas inlet hole 521 on the plane perpendicular to the axial direction of the through-hole 210 may be easier to be located outside the orthographic projection of the first gas inlet hole 512 on the plane perpendicular to the axial direction of the through-hole 210. Thus, a staggered effect of the second gas inlet hole 521 and the first gas inlet hole 512 may be better.

Figure 6:
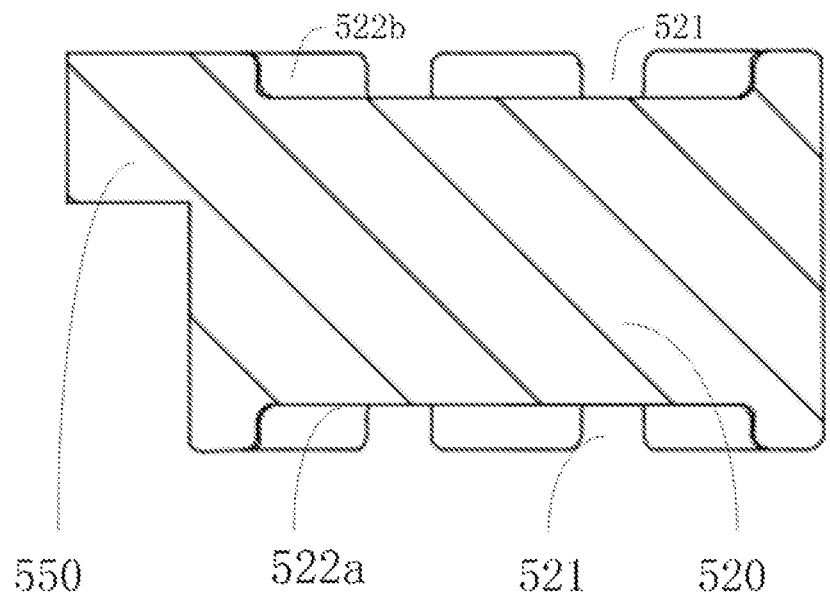
FIG. 6 is a schematic cross-sectional diagram showing a second insulation block in the reaction chamber according to the first embodiment of the present disclosure.
Figure 7:
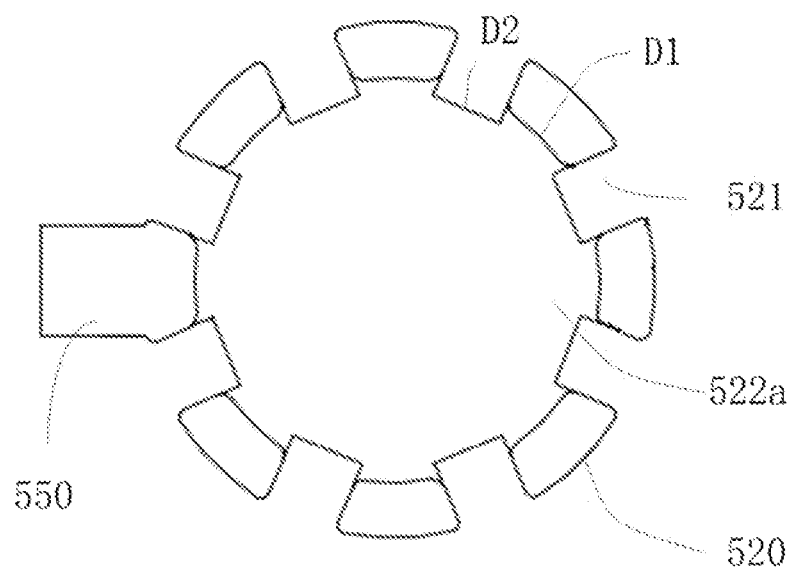
FIG. 7 is a schematic bottom view showing the second insulation block in the reaction chamber according to the first embodiment of the present disclosure.

In embodiments of the present disclosure, as shown in FIG. 6 and FIG. 7, a first groove 522a is arranged on a side of the second insulation block 520 facing the inner chamber 110. The first groove 522a and the inner wall of the accommodation space 511 may form a first gas chamber. The first gas inlet hole 512 may be communicated with the second gas inlet hole 521 through the first gas chamber. When the process is performed, the reaction gas may first enter the first gas chamber via the second gas inlet hole 521. The reaction gas that enters the first gas chamber may flow into the inner chamber 110 via the first gas inlet hole 512. In such a manner, the first gas inlet hole 512 may be facilitated to be communicated with the second gas inlet hole 521, and other parts on a side of the second insulation block 520 facing the inner chamber 110 may be better supported in the accommodation space 511, which facilitates the overall assembly. Of course, in practical applications, the communication between the first gas inlet hole 512 and the second gas inlet hole 521 may be realized by using any other structure.

In embodiments of the present disclosure, in an optional solution, as shown in FIG. 7, a plurality of second gas inlet holes 521 are included and are distributed along a circumferential direction of the first groove 522a at intervals. The plurality of second gas inlet holes 521 may be configured to increase a circulation rate of the reaction gas. Meanwhile, diameters of the plurality of second gas inlet holes 521 may be relatively small. Thus, the radio frequency electric field may be difficult to be generated between the flange part 540 and the upper cover 200 and a powered-on part of the upper cover 200, thereby better preventing generation of accidental discharge.

Moreover, the orthographic projection of an inner peripheral surface of the first groove 522a on the plane perpendicular to the axial direction of the through-hole 210 may overlap with orthographic projections of the plurality of second gas inlet holes 521 on the plane perpendicular to the axial direction of the through-hole 210. For example, a plurality of gas inlet grooves may be arranged on the outer peripheral surface of the second insulation block 520 and distributed along a peripheral direction of the second insulation block 520 at intervals. The gas inlet grooves may form a plurality of second gas inlet holes 521 with the inner wall of the accommodation space 511. Moreover, as shown in FIG. 7, diameter D1 of the first groove 522a is larger than diameter D2 of an inscribed circle formed by inner side edges of the plurality of gas inlet grooves. Thus, the first groove 522a may be communicated with the gas inlet grooves.

In embodiments of the present disclosure, as shown in FIG. 6, a side of the second insulation block 520 facing away from the inner chamber 110 may be provided with a second groove 522b. The second groove 522b may form a second gas chamber with the flange part 540. The gas outlet end of the gas inlet pipe 530 may be communicated with the gas inlet end of the second gas inlet hole 521 through the second gas chamber. When the process is performed, the reaction gas in the gas inlet pipe 530 may first enter the second gas chamber, and then enters the second gas inlet hole 521 through the second gas chamber. In such a manner, the gas inlet pipe 530 may be facilitated to be communicated with the second gas inlet hole 521. Under this situation, the gas inlet pipe 530 may not need to be directly connected to the second gas inlet hole 521. Thus, assembly difficulty may be reduced. At the same time, when a plurality of second gas inlet holes 521 are included, the second gas chamber may enable the reaction gas flowing out from the gas inlet pipe 530 to flow into the second gas inlet holes 521. Thus, while the circulation rate of the reaction gas is increased, generation of an accidental discharge phenomenon may be prevented.

Optionally, as shown in FIG. 1, a third groove 541 is arranged on a side of the flange part 540 facing the second insulation block 520. The third groove 541 may be butted with the second groove 522b to form the second gas chamber to realize the communication between the gas inlet pipe 530 and the second gas inlet hole 521. Of course, in practical applications, only the second groove 522b may be provided, or only the third groove 541 may be provided.

Similarly, a plurality of first gas inlet holes 512 may be provided and arranged at the first insulation block 510 at intervals. The plurality of first gas inlet holes 512 may enable the gas flowing out of the second gas inlet hole 521 to flow quickly into the inner chamber 110. Similarly, diameters of the plurality of first gas inlet holes 512 may be relatively small. Thus, the radio frequency electric field may be difficult to be formed between the flange part 540 and the upper cover 200 and the powered-on part of the upper cover 200, and generation of accidental discharge may be better prevented. Optionally, under such a situation, the plurality of second gas inlet holes 521 may be provided at the second insulation block 520 at intervals. The plurality of second gas inlet holes 521 may be communicated with the plurality of first gas inlet holes 512 to increase the circulation rate of the reaction gas.

Figure 2:
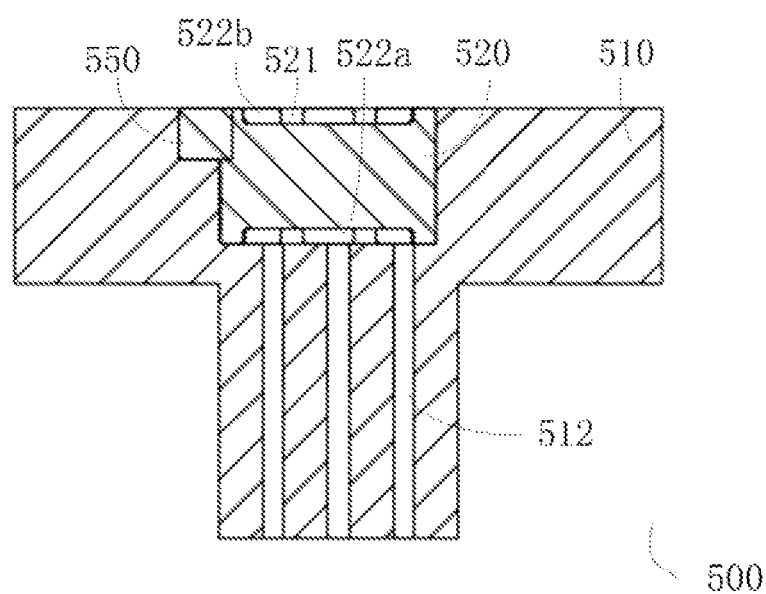
FIG. 2 is a schematic cross-sectional diagram showing a part of an insulation body in the reaction chamber according to the first embodiment of the present disclosure.

In embodiments of the present disclosure, the gas inlet mechanism may further include a position limiting structure. The position limiting structure may be arranged between the outer peripheral surface of the second insulation block 520 and the inner wall of the accommodation space 511 to limit rotation of the second insulation block 520 in the accommodation space 511. For example, as shown in FIG. 2, the position limiting structure includes a convex member 550 arranged on the outer peripheral surface of the second insulation block 520 and a concave member arranged on the inner wall of the accommodation space 511. The convex member 550 may cooperate with the concave member to prevent the second insulation block 520 from rotating in the accommodation space 511. Optionally, the convex member 550 may be an integral structure with the second insulation block 520. In this case, the inner wall of the accommodation space 511 may be provided with a mounting groove, and at least a part of the convex member 550 may be located in the mounting groove.

In embodiments of the present disclosure, the first insulation block 510 may include a body member 513 and a position limiting member 514. The body member 513 may be connected to the position limiting member 514. The body member 513 may be arranged in the through-hole 210. The position limiting member 514 may be position-limited and cooperate with a side of the through-hole 210 facing away from the inner chamber 110. With such a manner, the connection between the first insulation block 510 and the through-hole 210 may be facilitated. At the same time, the position limiting member 514 may not only have a position-limiting and cooperation function with the side of the through-hole 210 facing away from the inner chamber 110, but the position limiting member 514 may also have a relatively large outer surface. Thus, the accommodation space 511 may be facilitated to be arranged.

Second Embodiment

A difference of a reaction chamber provided by the second embodiment of the present disclosure, when the reaction chamber is compared to the reaction chamber of the first embodiment only includes that the structure of the insulation body is different. Specifically, referring to FIG. 8 and FIG. 9, in embodiments of the present disclosure, a gas inlet channel is arranged in the insulation body 500'. The insulation body 500' includes three insulation blocks sequentially arranged in a vertical direction (i.e., the same direction as the axial direction of the through-hole 210 in FIG. 1), which are a first insulation block 503a, a second insulation block 503b, and a third insulation block 503c arranged sequentially along a direction close to the inner chamber 110. The three insulation blocks may be sequentially stacked in the axial direction of the through-hole 210. A third gas inlet hole 501c may be arranged in the third insulation block 503c, a second gas inlet hole 501b may be arranged in the second insulation block 503b, and a first gas inlet hole 501a may be arranged in the first insulation block 503a. The first gas inlet hole 501a, the second gas inlet hole 501b, and the third gas inlet hole 501c may constitute three channel segments of the gas inlet channel, respectively.

A gas outlet end of the third gas inlet hole 501c may be communicated with the inner chamber 110, and a gas inlet end of the third gas inlet hole 501c may be communicated with a gas outlet end of the second gas inlet hole 501b, for example, through a second connection channel 502b arranged in the insulation body 500'. A gas inlet end of the second gas inlet hole 501b may be communicated with a gas outlet end of the first gas inlet hole 501a, for example, through a first connection channel 502a arranged in the insulation body 500'. A gas inlet end of the first gas inlet hole 501a may be communicated with a gas outlet end of the gas inlet pipe configured to transfer the reaction gas through the flange part. The flange part and the gas inlet pipe may adopt the same structure as the flange part 540 and the gas inlet pipe 530 shown in FIG. 1. In this way, the reaction gas in the gas inlet pipe 530 may sequentially pass through the first gas inlet hole 501a, the second gas inlet hole 501b, and the third gas inlet hole 501c to flow into the inner chamber 110.

Figure 8:
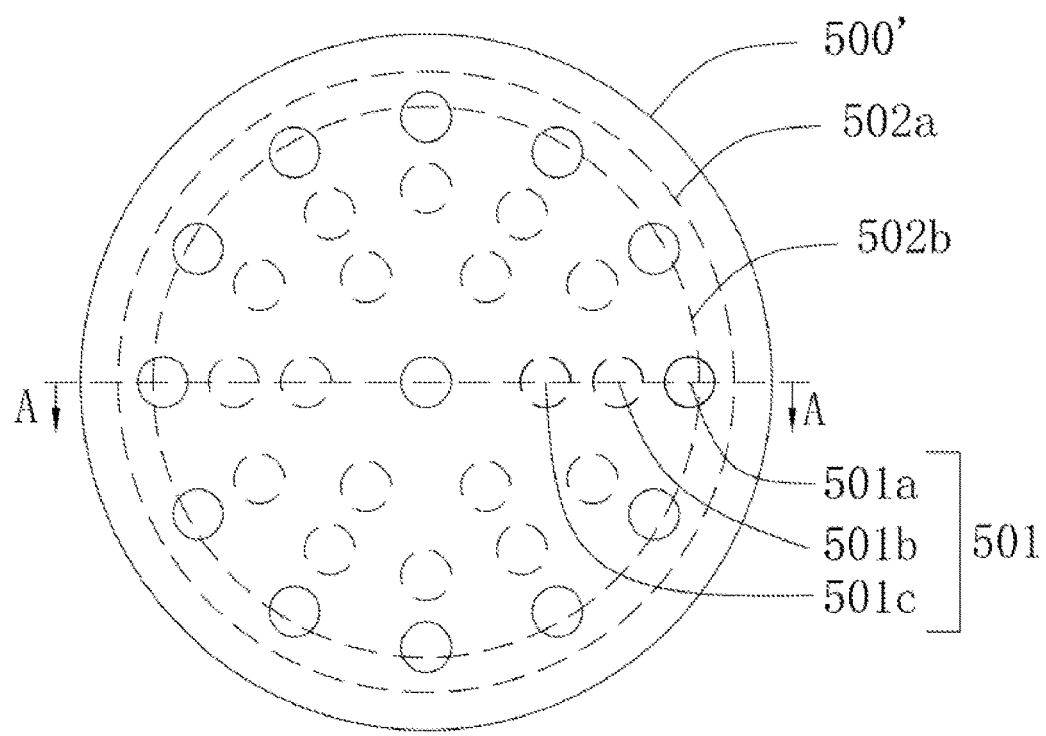
FIG. 8 is a schematic top view showing an insulation body in the reaction chamber according to a second embodiment of the present disclosure.

In embodiments of the present disclosure, as shown in FIG. 8, orthographic projections of the first gas inlet hole 501a, the second gas inlet hole 501b, and the third gas inlet hole 501c are staggered from each other on a plane perpendicular to the vertical direction. That is, any two axes of an axis of the first gas inlet hole 501a, an axis of the second gas inlet hole 501b, and an axis of the third gas inlet hole 501c are not in a straight line. For example, an orthographic projection of the second gas inlet hole 501b is outside an orthographic projection of the third gas inlet hole 501c. An orthographic projection of the first gas inlet hole 501a is located outside the orthographic projection of the second gas inlet hole 501b. In this way, when the upper cover is powered-on through the electrode, a radio frequency electric field may be difficult to be formed between the grounded flange part and the upper cover and the powered-on part of the upper cover. Thus, occurrence of accidental discharge phenomenon may be reduced, a risk of generating the sparking phenomenon may be reduced, and finally, the uniformity and stability of the surface material of the substrate may be improved.

Figure 9:
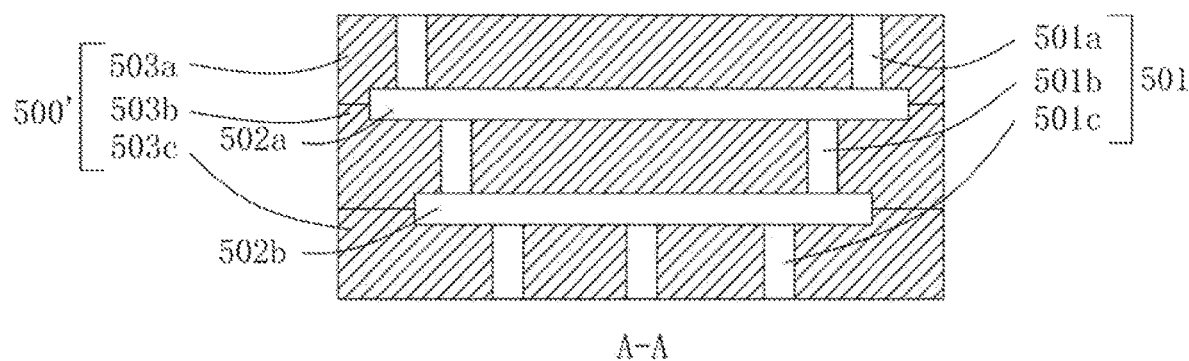
FIG. 9 is a schematic cross-sectional diagram showing the insulation body in the reaction chamber along line A-A in FIG. 8 according to the second embodiment of the present disclosure.

In embodiments of the present disclosure, as shown in FIG. 9, grooves are arranged on two opposite surfaces of the second insulation block 503b and the third insulation block 503c, respectively. The two grooves may be butted to form the first connection channel 502a. Similarly, grooves are arranged on two opposite surfaces of the second insulation block 503b and the first insulation block 503a, respectively. The two grooves may be butted to form the second connection channel 502b. Of course, in practical applications, a groove may also be provided on one of the two opposite surfaces of the second insulation block 503b and the third insulation block 503c, and the first connection channel 502a may also be formed. Moreover, a groove may be provided on one of the two opposite surfaces of the second insulation block 503b and the first insulation block 503a, and the second connection channel 502b may be also formed. In addition, in practical applications, the communication between the first gas inlet hole 501a and the second gas inlet hole 501b and the communication between the second gas inlet hole 501b and the third gas inlet hole 501c may be realized in any other manners, which is not particularly limited in embodiments of the present disclosure.

In embodiments of the present disclosure, as shown in FIG. 8, optionally, a plurality of the first gas inlet holes 501a are provided and arranged along a peripheral direction of the insulation body 500' at intervals. Similarly, a plurality of second gas inlet holes 501b are provided and arranged along the peripheral direction of the insulation body 500' at intervals. The plurality of second gas inlet holes 501b are located on an inner side of the plurality of first gas inlet holes 501a. A plurality of third gas inlet holes 501c are provided and arranged on an inner side of the plurality of second gas inlet holes 501b. Thus, the circulation rate of the reaction gas may be increased.

It should be noted that, in embodiments of the present disclosure, the insulation body 500' includes the three insulation blocks stacked in sequence in the vertical direction (i.e., the same direction as the axial direction of the through-hole 210 in FIG. 1). Thus, the gas inlet holes and corresponding grooves may be machined conveniently for the three insulation blocks, and eventually, the continuous gas inlet channel may be formed. Moreover, orthographic projections of any two adjacent channel segments of the gas inlet channel may be staggered from each other in the vertical direction. However, embodiments of the present disclosure are not limited to this. In practical applications, the insulation body may be divided into a plurality of partitions in any manner, as long as the gas inlet channel having the structure described above may be machined and obtained. Alternatively, the insulation body may also adopt an integrated structure. The gas inlet channel having the structure described above may be formed in the integrated insulation body by using an existing processing manner. For example, holes may be formed in different directions of the insulation body. The channel segments staggered with each other may be further machined through the opening holes, and the connection channel communicating the adjacent channel segments may be machined. Then, the opening holes may be blocked to obtain a closed gas inlet channel.

Other structures and functions not mentioned in the reaction chamber provided by the second embodiment of the present disclosure are not repeated here, since the other structures and functions are the same as the structures and functions in the first embodiment.

It should be noted that, in practical applications, a number of insulation blocks included in the insulation body may also be four or more according to specific requirements. In addition, an arrangement manner between any two adjacent insulation blocks is not limited to the nesting manner in the above embodiments (that is, the upper insulation block is arranged in the accommodation space of the lower insulation block) and the stacking manner. In practical applications, the insulation blocks may be arranged in any other manners, for example, in a concentrically surrounding manner.

In embodiments of the present disclosure, the differences between the embodiments are emphasized to be described. Different optimization features between the embodiments may be combined to form a better embodiment as long as there is no contradiction, which is not repeated here to keep the brevity of the text.

The above are only embodiments of the present disclosure and are not intended to limit the present disclosure. For those skilled in the art, various modifications and variations may be made to the present disclosure. Any modifications, equivalent substitutions, and improvements made within the spirit and principle of the present application should be within the scope of the claims of the present application.

What is claimed is:

1. A reaction chamber comprising:
a chamber body that is grounded;
an upper cover including an electrode, the chamber body being connected to the upper cover through an insulation member, the chamber body and the upper cover forming an inner chamber, and a through-hole that is communicated with the inner chamber being formed at the upper cover; and
a gas inlet mechanism including:
 a first insulation block partially arranged in the through-hole, an accommodation space being arranged on a side of the first insulation block away from the inner chamber, the first insulation block including a first gas inlet hole, an end of the first gas inlet hole being communicated with the inner chamber;
 a second insulation block arranged in the accommodation space and including a second gas inlet hole, the other end of the first gas inlet hole being communicated with the second gas inlet hole, in an axial direction of the through-hole, a projection the first gas inlet hole being outside a projection of the second gas inlet hole;

a gas inlet pipe arranged at an opening of the accommodation space and located above the second insulation block, the gas inlet pipe being communicated with the second insulation block; and a flange part body that is at least partially arranged in the through-hole;

wherein:

a gas inlet groove is arranged on an outer side surface of the second insulation block;

the gas inlet groove and an inner wall of the accommodation space form the second gas inlet hole;

a first groove is arranged on a side of the second insulation block facing the inner chamber;

the first groove and the inner wall of the accommodation space form a first gas chamber; and the first gas inlet hole and the second gas inlet hole are communicated with the first gas chamber.

2. The reaction chamber according to claim 1, wherein the first groove is an annular groove.

3. The reaction chamber according to claim 1, wherein a plurality of second gas inlet holes are arranged at the second insulation block at intervals.

4. The reaction chamber according to claim 1, wherein a plurality of first gas inlet holes are arranged at the first insulation block at intervals.

5. The reaction chamber according to claim 1, wherein the gas inlet mechanism further includes:

a position limiting structure, the second insulation block being fixed in the accommodation space by the position limiting structure.

6. The reaction chamber according to claim 1, wherein: a second groove is arranged on a side of the flange part facing the second insulation block; the second groove and the second insulation block form a second gas chamber; and the gas inlet pipe is communicated with the second gas inlet hole through the second gas chamber.

7. The reaction chamber according to claim 1, wherein the first insulation block includes:

an insulation body located at the through-hole; and a position limiting member connected to the insulation body, the position limiting member being position-limited and cooperating with a side of the through-hole away from the inner chamber.

* * * * *